(12) United States Patent
Thor et al.

(10) Patent No.: US 6,411,536 B1
(45) Date of Patent: Jun. 25, 2002

(54) RECTIFIER DEVICE, HAVING A COOLING BODY, FOR A THREE-PHASE DYNAMO OF A MOTOR VEHICLE

(75) Inventors: Volker Thor, Essen (DE); Johannes A. Rebergen, Venlo (NL); Peter Sommerfeld, Krefeld (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/670,132

(22) Filed: Sep. 26, 2000

(30) Foreign Application Priority Data

Sep. 27, 1999 (DE) .......................................... 199 46 259

(51) Int. Cl.[7] ................................................. H02M 1/10
(52) U.S. Cl. ..................................... 363/141; 310/68 D
(58) Field of Search ........................ 363/141; 310/68 D, 310/266

(56) References Cited

U.S. PATENT DOCUMENTS

| | | | | |
|---|---|---|---|---|
| 4,087,713 A | * | 5/1978 | Binder ........................ 310/266 |
| 4,538,169 A | * | 8/1985 | Smith et al. .................... 357/76 |
| 4,604,643 A | * | 8/1986 | Yotsumoto et al. ............. 357/75 |
| 4,628,219 A | * | 12/1986 | Troscinski ................ 310/68 D |
| 5,319,272 A | * | 6/1994 | Raad ......................... 310/68 D |
| 5,365,133 A | * | 11/1994 | Raad ......................... 310/68 D |

FOREIGN PATENT DOCUMENTS

| | | | |
|---|---|---|---|
| EP | 0110452 | 6/1984 | ........... H01L/23/36 |
| FR | 2489593 | 3/1982 | ........... H01L/25/10 |

* cited by examiner

Primary Examiner—Bao Q. Vu
(74) Attorney, Agent, or Firm—Ernestine C. Bartlett

(57) ABSTRACT

A rectifier device for a three-phase dynamo of motor vehicles has a cooling body, with at least one circuit carrier arranged on the cooling body and having a surface with an electrically conductive structure, having at least a first diode which is arranged on the electrically conductive structure of the surface of a circuit carrier and which is designed to rectify a first half wave, and having at least a second diode arranged on the cooling body and designed to rectify a second half wave.

1 Claim, 1 Drawing Sheet

Figure 1:
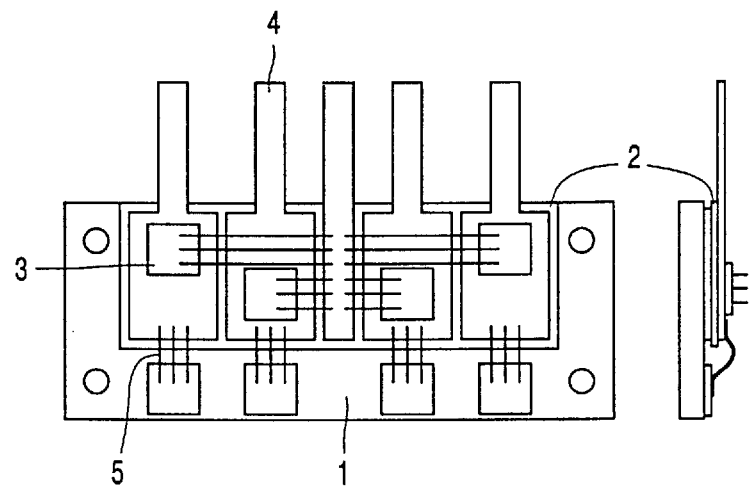

RECTIFIER DEVICE, HAVING A COOLING BODY, FOR A THREE-PHASE DYNAMO OF A MOTOR VEHICLE

BACKGROUND OF THE INVENTION

The invention relates to the construction of a rectifier device for the three-phase dynamo of a motor vehicle. According to the classic principle of the three-phase dynamo, three equal, mutually independent coils u, v, w are present which are arranged with mutual interspacings of 120° (stator). The excitation coil is present on the rotary part on the inside (rotor). The moment an excitation current flows through the coils, a magnetic field will arise which in its turn induces a three-phase AC voltage in the stator coils, which supplies the three-phase current when a load is connected. This current is rectified by means of a bridge rectifier circuit and serves to supply the loads and to charge the battery. The output voltage of the dynamo is controlled by a control unit (pulse width modulation of the excitation current, PWM), i.e. the average value of the excitation current is set in dependence on the instantaneously obtaining battery voltage.

Known electrical rectifier devices for motor vehicle applications are built up with diodes having special housings which are mechanically pressed in into metal cooling plates (so-called press-fit diodes), or which are soldered onto cooling plates. The construction of the electrical and thermal connection between the diodes and the cooling body (usually a cooling plate serving as a carrier for the components) is of special importance because the power losses in the relevant components must be removed sufficiently quickly in view of the high electrical current values (typically approximately 50 A up to 130 A) in the diodes. The mechanical interconnections of the (usually eight) diodes and the electrical connection points are usually formed by a metal pressed screen molded around with synthetic resin.

To realize a rectifier of the construction described above, diodes for the various half waves are mounted on separate cooling plates. The complete assembly then results in a rectifier device in which diodes at different levels are interconnected by complicated conductor configurations. This typeof assembly requires considerable expenditure and comprises many separate manufacturing steps. In addition, mechanical processes are required, such as riveting, screwing and spot welding, which are not ideal for the electrical components.

SUMMARY OF THE INVENTION

It is an object of the invention accordingly to provide a rectifier device for three-phase dynamos which has improved properties as regards its manufacturing technology.

This object is achieved with a rectifier device, having a cooling body, for a three-phase dynamo of a motor vehicle comprising a cooling body, comprising at least one circuit carrier arranged on the cooling body and having an electrically conductive structure on its surface, comprising at least a first diode arranged on the surface of a circuit carrier with an electrically conductive structure and designed for rectifying a first half wave, and comprising at least a second diode arranged on the cooling body and designed for rectifying a second half wave. The rectifier device according to the invention utilizes the modular construction method of power electronics technology for realizing a rectifier for a three-phase dynamo which renders possible a compact and simplified assembly. Naked semiconductor diode chips (i.e. without housings) are joined together into a rectifier device above a power substrate (for example, a direct bonded copper or DBC substrate) provided on a cooling body. All diodes are in one plane here and electronic manufacturing processes such as, for example, automatic component placement, SMD soldering, and wire bonding can be used. This means that the manufacture can take place on normal installations for electronic manufacture without specially designed machines. The constructive incorporation of the semiconductor diodes of the rectifier into the overall assembly is given most attention here. In general, however, the invention may be used for all applications with power semiconductors.

The thermal resistance of the rectifier device described above can achieve substantially lower values than is the case in conventional solutions. Construction and connection technologies are known from electronics manufacture. The rectifier device can be given smaller dimensions because of its construction and the low thermal resistance compared with traditional solutions. The module with a cooling plate is highly suitable for water-cooled three-phase dynamos.

Figure 2:
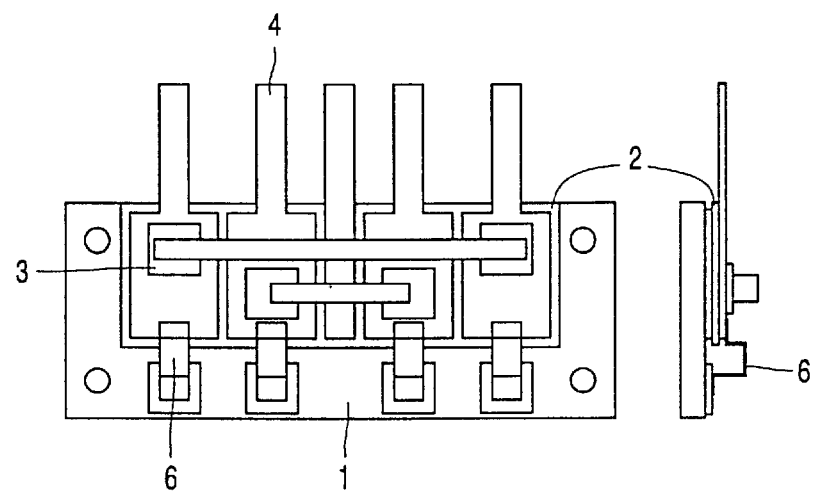
Figure 3:
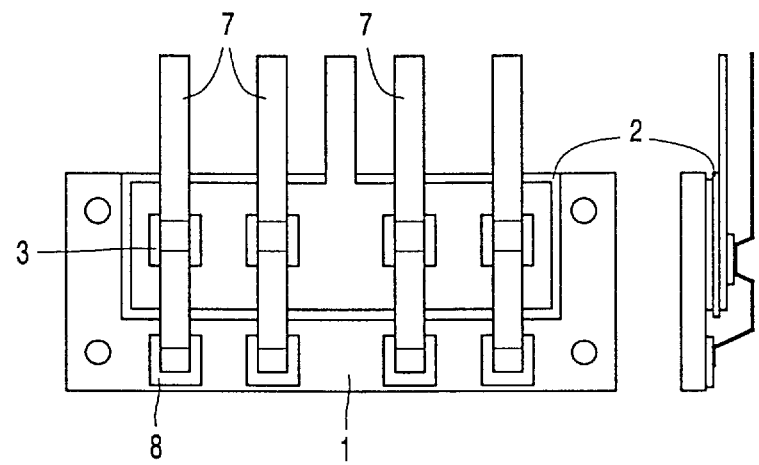

An embodiment of the invention will be explained in more detail below with reference to drawings, in which In the drawing:

FIG. 1 is a diagrammatic picture of a rectifier device with wire bonding connections, FIG. 2 is a diagrammatic picture of a rectifier device with soldering tags, and FIG. 3 is a diagrammatic picture of a rectifier device with pressed screens.

DETAILED DESCRIPTION OF THE INVENTION

An embodiment of the invention will now be explained in more detail below with reference to the drawings.

FIG. 1 diagrammatically shows a rectifier device according to the invention with wire bonding connections. A substrate 2 (for example made of ceramic material) metallized on both sides (for example with a copper metallization) is provided on a cooling body 1. The cooling body 1 may be formed as a plate, in which case the heat is removed through contact with a cooling surface, or as a cooling body fitted with ribs which is cooled by an air flow. The connection between the substrate 2 and the cooling body 1 is to be achieved with a heat-conductive material. This may be, for example, a solder connection, in which air and gas inclusions in the connection are reduced by means of a special process.

The naked semiconductor diode chips 3 are directly soldered on the upper side of the substrate 2 and directly on the cooling body 1. They provide the rectification of the three phases for both half waves. Special attention is again to be paid to minimizing the air and gas inclusions in the solder layer during soldering of the diode chips 3. The cooling body 1 electrically represents the ground of the module. The individual stator phases of the three-phase generator and the battery connection are obtained on the metallized upper side of the substrate 2 or by means of pressed screens. The substrate 2 metallized on both sides is laterally provided with connections 4 for the battery and the stator phases of the three-phase dynamo. The metallization is structured such that it comprises regions with connections for the semiconductor diode chips 3. These chips are directly soldered on the cooling body 1 for one half wave and on the substrate 2 for the other half wave. Wire bonding connections 5 provide the electrical contacting of the upper chip surfaces. These are of multiple construction so as to carry the strong currents. The entire arrangement can be enclosed in a frame or housing, so that the semiconductor diode chips 3 can be protected with a soft molding compound. Alternatively, the construction may be injection-molded all round with a duroplastic substance.

The rectifier device shown in FIG. 2 corresponds to the one shown in FIG. 1. The electrical contacting of the upper semiconductor chip surfaces 3 is achieved here by means of soldering tags 6. These have the advantage that they draw the current over a wide surface area from the semiconductor. This reduces the contact resistance and thus the heat generation at the semiconductor side. Mounting of the tags 6 may be achieved in a standard electronic mounting process without an additional process such as wire bonding being necessary.

In the rectifier device shown in FIG. 3, the substrate 2 metallized on both sides has a continuous upper surface for accommodating the semiconductor diode chips 3. These are soldered as in the other embodiments. The substrate 2 and additional diodes 8 are soldered on the cooling body 1. The diodes 8 are provided with small soldering plates (for example of nickel-plated copper) at both sides. This renders it possible to solder the diodes with large solder surfaces at both sides in mesa structure technology without the risk of causing short-circuits. The connection between the diodes 3 and 8 is provided by single pressed screens 7 which at the same time form the contacts for the stator phases. These pressed screens 7 are provided on the diodes 3 and 8 with electrical conduction (for example in the soldering process). The module may finally be protected in a similar manner as the embodiment shown in FIG. 2.

What is claimed is:

1. A rectifier device for a three-phase dynamo of a motor vehicle, comprising a cooling body (1), comprising at least one circuit carrier (2) which is arranged on the cooling body (1) and which has a surface with an electrically conductive structure, comprising at least a first diode (3) which is arranged on the electrically conductive structure of the surface of the circuit carrier (2) and which is designed for rectifying a first half wave, and comprising at least a second diode (8) arranged on the cooling body (1) and designed for rectifying a second half wave.

* * * * *